United States Patent [19]
Ash et al.

[11] Patent Number: 5,789,990
[45] Date of Patent: Aug. 4, 1998

[54] FEEDBACK OSCILLATOR CIRCUIT USING A SAW RESONATOR FILTER

[75] Inventors: Darrell L. Ash, Sachse; Benjamin P. Abbott, Dallas, both of Tex.

[73] Assignee: RF Monolithics, Inc., Dallas, Tex.

[21] Appl. No.: 599,940

[22] Filed: Feb. 14, 1996

[51] Int. Cl.$^6$ ............................................ H03B 5/32
[52] U.S. Cl. ............................ 331/107 A; 331/116 R; 331/116 FE
[58] Field of Search ..................... 331/107 A, 116 R, 331/116 FE

[56] References Cited

U.S. PATENT DOCUMENTS

| | | |
|---|---|---|
| 3,739,299 | 6/1973 | Adler ........................... 331/116 R |
| 3,743,968 | 7/1973 | Miyake et al. ................ 331/116 R |
| 4,144,507 | 3/1979 | Shreve ......................... 333/191 |
| 4,454,488 | 6/1984 | Hartmann ..................... 333/195 |
| 4,616,197 | 10/1986 | Wright ........................ 333/194 |
| 4,843,349 | 6/1989 | Nugent et al. ................ 331/116 R |

Primary Examiner—Timothy P. Callahan
Assistant Examiner—An T. Luu
Attorney, Agent, or Firm—Jones, Day, Reavis & Pogue

[57] ABSTRACT

A crystal-controlled oscillator circuit is modified by the present invention by replacing the crystal with the first signal port of a two-port SAW resonator filter that has a low-loss primarily inductive characteristic and taking the oscillation output from the other port of the filter to provide an oscillator frequency with harmonics that are reduced significantly when compared to the output of a crystal-controlled oscillator.

14 Claims, 3 Drawing Sheets

FEEDBACK OSCILLATOR CIRCUIT USING A SAW RESONATOR FILTER

BACKGROUND OF THE INVENTION

1. Field of the Invention

The present invention relates in general to oscillators and specifically to crystal-controlled oscillators in which the crystal is replaced with a two-port surface acoustic wave resonator filter.

2. Description of the Related Art Including Information Disclosed Under 37 CFR 1.97 and 1.98

It is well known in the prior art that one way of making an oscillator is to apply positive feedback to an amplifier. It is also known that the effects of temperature and aging of inductors and capacitors are major factors in frequency instability in oscillators. The instability frequently causes large variations from the design frequency. It is desired that oscillator frequencies be maintained to within a very few parts per million. Although stability of that order can be reached with well designed temperature compensated circuits, they are difficult and expensive to maintain.

It is well known that the resonant circuit of an oscillator can be replaced with a mechanically vibrating piezoelectric crystal. A great increase in frequency stability is obtained with the use of the crystal. In such crystals, if mechanical stresses are applied onto opposite faces, electrical charges appear on some other pair of faces. The converse effect is also present; that is, if electrical charges are placed on two opposite crystal faces by applying a voltage across the faces, a mechanical strain and change in dimensions are produced between two other opposite faces.

An alternating voltage applied to electrodes positioned on the faces of the crystal causes the crystal to vibrate and at a natural frequency of mechanical resonance, these vibrations become very large. The crystal tends to vibrate at a natural frequency unless driven and these mechanical resonances depend only on crystal characteristics as is well known in the art.

Since a crystal acts as an electrical resonant circuit, it is only natural that it be employed as the frequency-determining resonant circuit for an oscillator. There are many crystal-controlled feedback oscillators. These crystal-controlled oscillator circuits have an amplifier, a signal feedback circuit, a crystal for controlling the oscillator frequency, and an output signal terminal. One of the well-known crystal-controlled oscillators is the Colpitts oscillator using a series resonant crystal to ground a transistor amplifier base. Another is the Colpitts oscillator with the crystal in a series resonant mode between the emitter of the transistor amplifier and the junction of two capacitors coupling the collector to a ground terminal.

Another of the most commonly used crystal oscillator circuits is the Pierce oscillator. This is basically a common-source Colpitts circuit with the crystal forming a resonant circuit with a first capacitor that couples the source and the drain and a second capacitor that couples the gate and the source with the source being at ground potential.

Still another well-known circuit is the Miller oscillator in which both the crystal and an output tank circuit look like inductive reactances at the oscillation frequency.

Yet another well-known oscillator is the Clapp oscillator which is actually a Pierce oscillator with the base rather than the emitter at AC ground. The Clapp oscillator can be thought of as a grounded-base amplifier stage loaded with a tank circuit. The tank circuit has a capacitive tap from which energy is fed back to the emitter.

In all of these circuits, it is well known that the amplifiers have some degree of nonlinearity. The existence of nonlinearity implies distortion. In other words, the output will contain not only the desired frequency but also some of its harmonics. In some applications, the presence of harmonics may be unimportant but in others there is a requirement of a sine wave of the highest possible purity. One fairly obvious way of removing unwanted harmonics is to pass the output of the oscillator through a suitable tuned band-pass or low-pass filter. This works quite well if the frequency of the oscillator is fixed, but it is very inconvenient if a variable frequency is required as the filters then have to be tuned in step with the change in desired frequency. Such filters are normally designed with capacitors and inductors to form either low-pass or band-pass filters coupling the oscillator output to the desired load. Of course, there are other types of filter circuits that can also be used. Such filters are expensive and require the use of additional space where space is at a premium.

It would be advantageous to have a crystal-controlled oscillator that has an output signal containing very low harmonics and which can be simply and easily constructed.

SUMMARY OF THE INVENTION

The present invention overcomes the disadvantages of the prior art by enabling any crystal-controlled oscillator circuit to provide an output signal having very low harmonics contained therein simply by removing the crystal in the circuit and replacing it with a well-known two-port surface acoustic wave resonator filter such as shown in commonly assigned U.S. Pat. No. 4,616,197. While the term "surface acoustic wave resonator filter" will be used herein for ease of explanation, it should be understood that other piezoelectric devices could be used such as STW (surface transverse wave) devices. One port of the surface acoustic wave resonator filter is coupled to the terminals where the crystal had been removed. The other port serves as the output terminals for the oscillator signal frequency. The first port of the two-port SAW resonator filter acts similar to a crystal to determine the oscillation frequency of the oscillator and, in some oscillators, also provides the necessary feedback. The second port terminals provide the output terminal for the oscillator frequency. The two-port SAW resonator filter is designed at the desired oscillation frequency and thus not only provides the necessary crystal effect for the oscillator but also provides necessary filtering to produce an output signal with low harmonic content without any additional components being required in the circuit. Thus, existing oscillator circuits are easily modified and original equipment is easily manufactured using the present invention.

Thus, it is an object to the present invention to generally provide a crystal-controlled oscillator circuit using a two-port surface acoustic wave resonator filter with one port replacing the crystal and the other port serving as the output terminal to provide the output oscillator signal with greatly reduced harmonics.

The present invention relates to an improved crystal-controlled oscillator circuit having an amplifier, a signal feedback circuit, a crystal for controlling the oscillator frequency, and an output signal terminal, and wherein a piezoelectric material having first and second electrical signal ports therein is added to the crystal-controlled oscillator circuit with the first signal port replacing the crystal in the oscillator circuit and the second signal port forming the output terminal for providing the oscillator frequency having substantially reduced harmonics when compared to the output of the original crystal-controlled oscillator.

It is another object of the present invention to provide a two-port SAW resonator filter as the piezoelectric material having the first and second ports thereon.

It is still another object of the present invention to improve crystal-controlled oscillator circuits such as the Colpitts oscillator circuit, the Pierce oscillator circuit, the Miller oscillator circuit, the Clapp oscillator circuit, and any crystal-controlled feedback oscillator circuit.

BRIEF DESCRIPTION OF THE DRAWINGS

These and other features of the present invention will be more fully disclosed when taken in conjunction with the following DETAILED DESCRIPTION OF THE PREFERRED EMBODIMENT in which like numerals represent like elements and in which.

DETAILED DESCRIPTION OF THE PREFERRED EMBODIMENT

While the circuits of FIGS. 1–10 herein represent the most common feedback oscillators having an amplifier in the form of usually a junction transistor operating in a common-base configuration, it is to be understood that other transistor connections and other active devices such as FETs or integrated circuit RF amplifiers can be used and that the invention can be used with any crystal-controlled feedback oscillator circuit.

Figure 1:
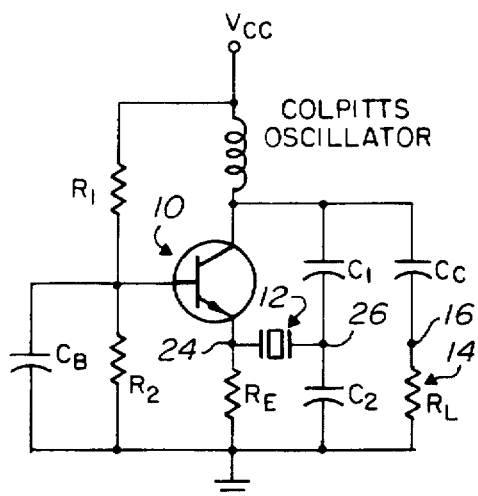
FIG. 1 is a circuit diagram of a prior art Colpitts oscillator using the crystal in the series-resonance mode.
Figure 11A:
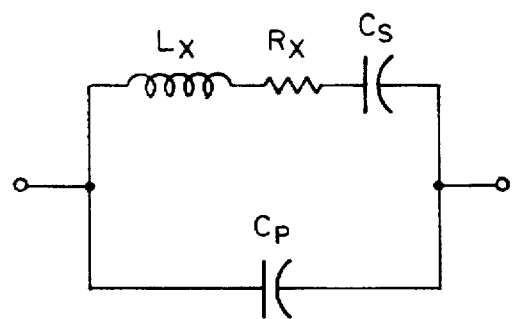
FIG. 11($a$) is the equivalent electrical circuit of a crystal and FIG. 11($b$) is a graph of the reactance curves for the circuit of FIG. 11($a$)
Figure 11B:
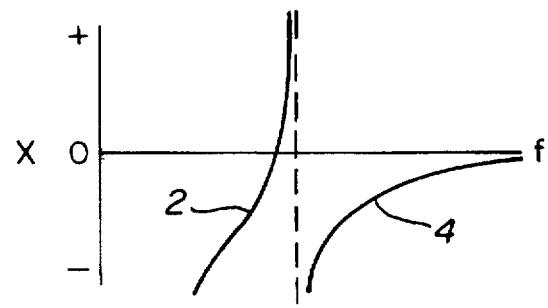

In the circuit of FIG. 1, the Colpitts oscillator is a well-known oscillator circuit that includes the transistor 10 as an amplifier or gain element, the crystal 12 serving as the signal feedback circuit and also establishing the oscillator frequency, and a load resistor 14. The output signal can be developed at an output terminal 16 across the load resistance 14. The piezoelectric crystal 12 has an equivalent electrical circuit as shown in FIG. 11($a$). It has an inductance, $L_x$, a resistance, $R_x$, and a capacitance, $C_x$, all in series and the series circuit is paralleled by a capacitance, $C_p$, that represents the capacitance introduced by the crystal electrodes. FIG. 11($b$) illustrates the reactance curves for the crystal circuit of FIG. 11($a$) and shows that there is a possibility of both resonant and anti-resonant modes of operation occurring as illustrated by curves 2 and 4, respectively.

Figure 2:
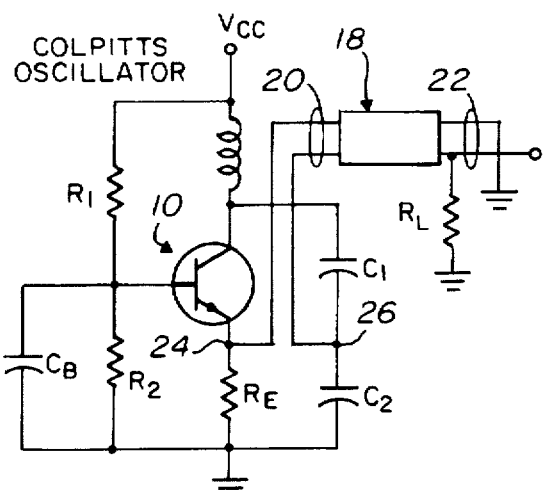
FIG. 2 illustrates the same oscillator with the crystal being replaced by the two-port SAW resonator filter to form the novel oscillator of the present invention.
Figure 12:
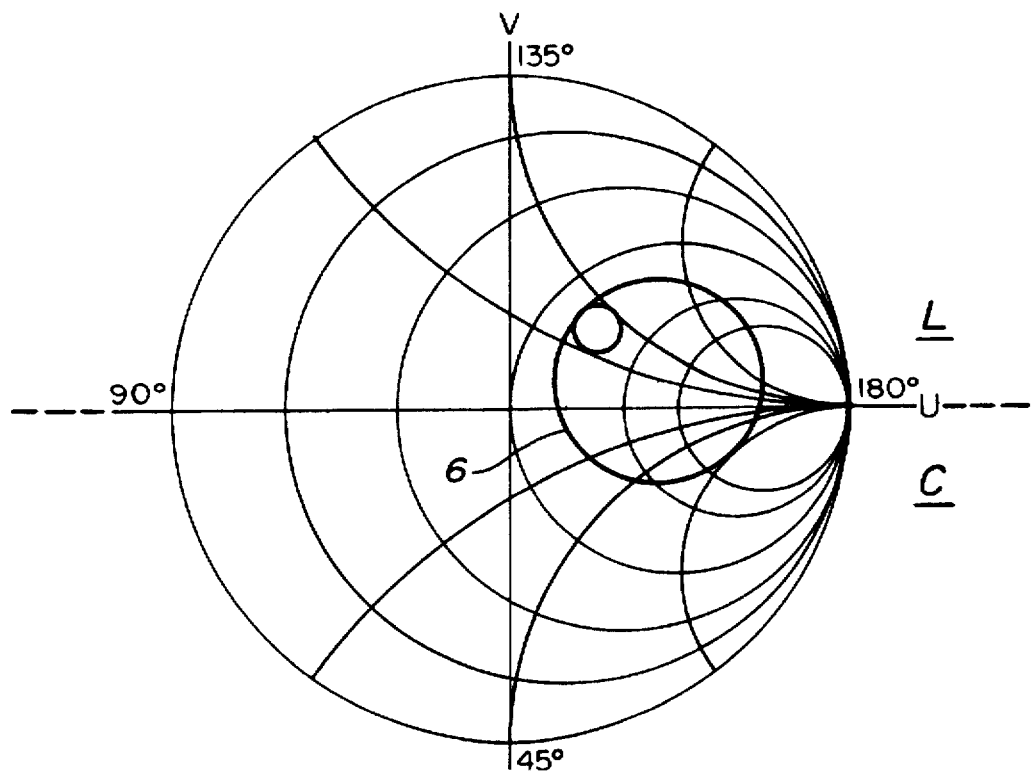
FIG. 12 is a Smith chart illustrating the desired inductive operation of the present SAW port that replaces the crystal of the prior art.

FIG. 2 is an improved version of the Colpitts oscillator of FIG. 1 according to the present invention. It will be noticed in FIG. 2 that the crystal 12 of FIG. 1 has been replaced with an element 18 formed of a piezoelectric material having a first electrical signal port 20 and a second electrical signal port 22. The terminals of the first signal port 20 are connected to the terminals 24 and 26 from which the crystal 12 was removed. The second signal port terminals 22 form the output terminal for providing the oscillator frequency. Because the element 18 is a two-port SAW resonator filter, designed at the frequency at which the circuit oscillates, it has relatively low harmonic levels at the output. The first port 20 of the two-port SAW resonator filter 18 has a similar equivalent circuit as shown in FIG. 11($a$). In order for the filter 18 to operate most efficiently in the application of the present invention, the impedance characteristic of the equivalent circuit should be a low-loss circuit with the value of $R_x$ and $C_p$ minimized as much as practicable and the circuit should have a primarily inductive mode of operation as shown by curve 6 on the well-known Smith chart in FIG. 12. Such design characteristics can be obtained by those skilled in the SAW device art.

Figure 3:
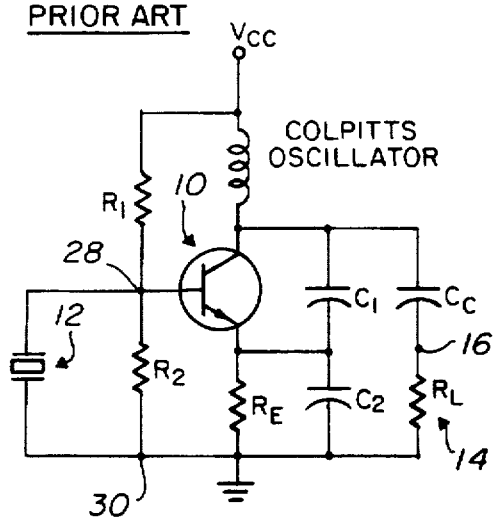
FIG. 3 is a circuit diagram of a prior art Colpitts oscillator using a series-resonant crystal to ground the transistor base.

FIG. 3 is a circuit diagram of a Colpitts oscillator similar to that shown in FIG. 1 except that it uses a series-resonant crystal 12 to ground the transistor base. The crystal 12 grounds the base of transistor 10 at terminal 28 at the crystal center frequency. Thus, the frequency of the oscillator is established. The output is developed across resistor 14 at terminal 16. Again, because of the nonlinearity of amplifier 10, harmonics are found in the output signal of the oscillator.

Figure 4:
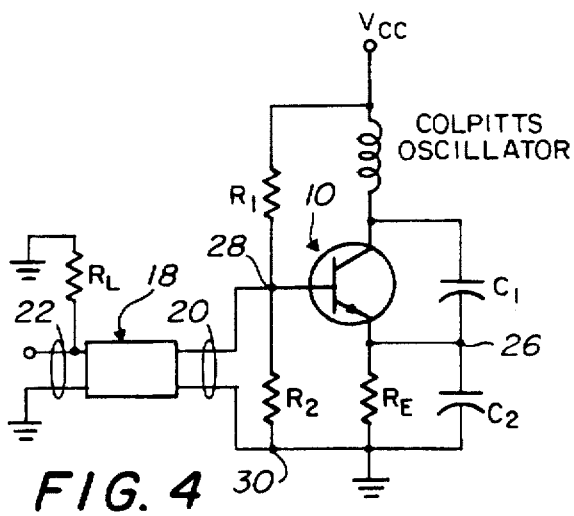
FIG. 4 is a circuit diagram of the Colpitts oscillator of FIG. 3 with the crystal therein being replaced by the two-port surface acoustic wave resonator filter of the present invention to provide a Colpitts oscillator circuit having an output signal with very low harmonic content.

FIG. 4 is a circuit diagram of the oscillator in FIG. 3 except that the crystal 12 has been replaced with the two-port SAW resonator filter 18 with its input port terminals 20 being connected to the terminals 28 and 30 to which the crystal 12 had previously been connected. The output signal is taken from the second port 22. Again, because the device 18 is a SAW resonator filter, the output terminals 22 generate a signal that has very low harmonic content when compared to the original crystal feedback oscillator of FIG. 3.

Figure 5:
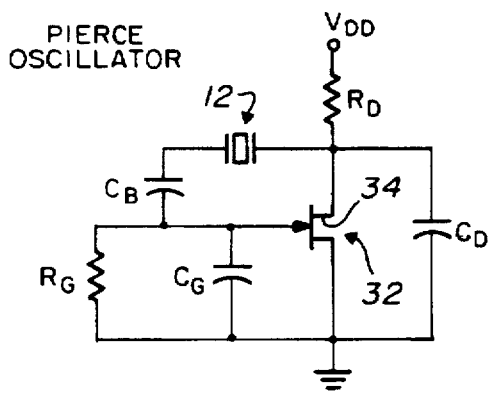
FIG. 5 is a circuit diagram of a prior art Pierce crystal oscillator.

FIG. 5 is a circuit diagram of one of the most commonly used oscillator circuits known as the Pierce oscillator. This is basically a common-source Colpitts circuit with the crystal forming a resonance circuit with the source-drain capacitor $C_D$ and the gate-ground capacitor $C_G$ and the internal capacitances of the FET 32. The circuit can be tuned by varying both $C_G$ and $C_D$ or by adding a small variable capacitance across the crystal 12. The RF load resistance is $R_D$. It could be bypassed with an RF choke if necessary to keep direct current out of the load. The blocking capacitor $C_B$ is intended to be a short circuit to the RF signals. The Pierce circuit lacks an inductor and its frequency may be changed without retuning by replacing the crystal. This is important in applications that require transmitters and receivers that are capable of rapid switching between several crystal-controlled channels.

Figure 6:
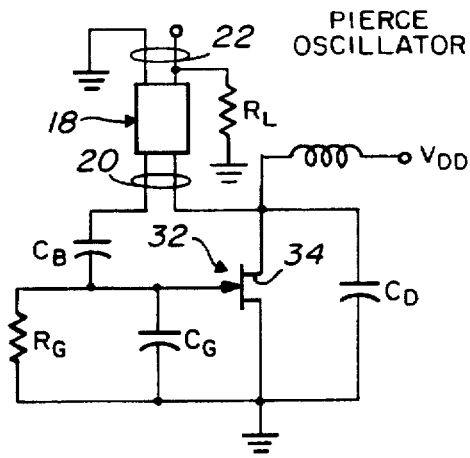
FIG. 6 is the circuit diagram of the Pierce crystal oscillator of FIG. 5 with the crystal therein replaced by the two-port surface acoustic wave resonator filter of the present invention to provide an oscillator output signal having very low harmonic content.

FIG. 6 is a circuit illustrating the Pierce oscillator of FIG. 5 modified to form an oscillator of the present invention. In FIG. 6, the crystal 12 has been replaced with the two-pole SAW resonator filter 18. It has a first port 20 whose terminals are connected between the capacitor $C_B$ and the drain 34 of the FET 32. Its output terminals 22 are formed using the terminals of the second port. Again, this oscillator circuit produces an output frequency that has very low harmonic content compared with the oscillator of FIG. 5.

Figure 7:
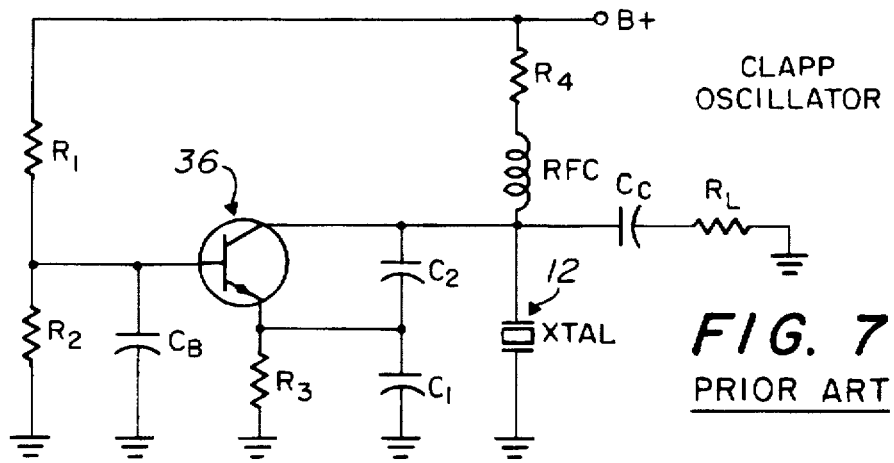
FIG. 7 is a circuit diagram of a prior art Clapp oscillator circuit having a crystal therein.

FIG. 7 is a circuit diagram of a prior art crystal oscillator known as the Clapp oscillator. The Clapp oscillator circuit shown in FIG. 7 is actually a Pierce oscillator with the base rather than the emitter at AC ground. The Clapp oscillator can be thought of as a grounded-base amplifier stage 36 with a tank circuit. The tank has a capacitive tap from which energy is fed back to the emitter. Again, the crystal 12 establishes the frequency of oscillation of the circuit. The output is derived across load resistor $R_L$ through coupling capacitor $C_c$.

Figure 8:
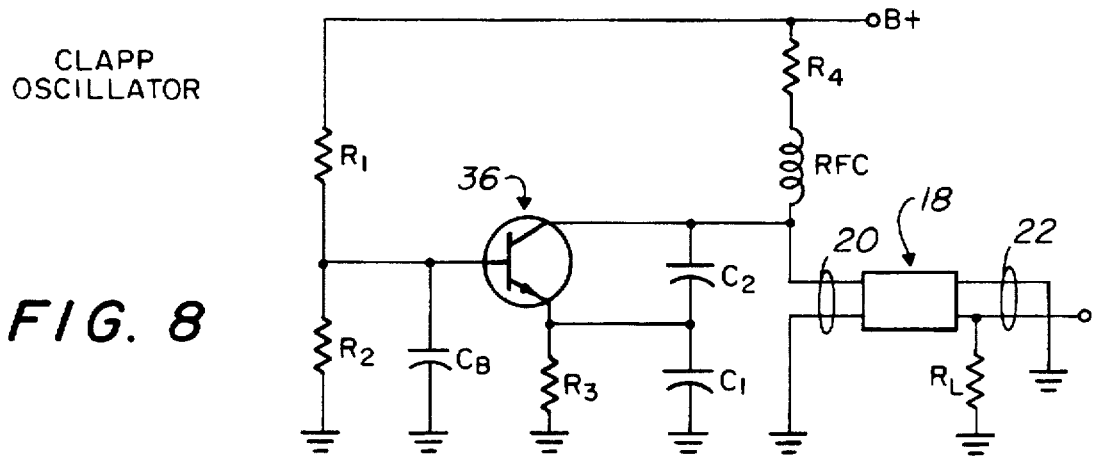
FIG. 8 is the Clapp oscillator circuit of FIG. 7 with the crystal therein replaced by the two-port surface acoustic wave resonator filter of the present invention.

FIG. 8 is a novel circuit diagram of the Clapp crystal oscillator of FIG. 7 that has been modified to form an oscillator of the present invention. Again, it has a two-port SAW resonator filter 18 having input port terminals 20 connected between the collector of transistor 36 and ground in place of the crystal 12. It also has its output port terminals 22 from which the output frequency signals are taken. Again, for reasons previously given, the output frequency of this oscillator has very low harmonic content.

Figure 9:
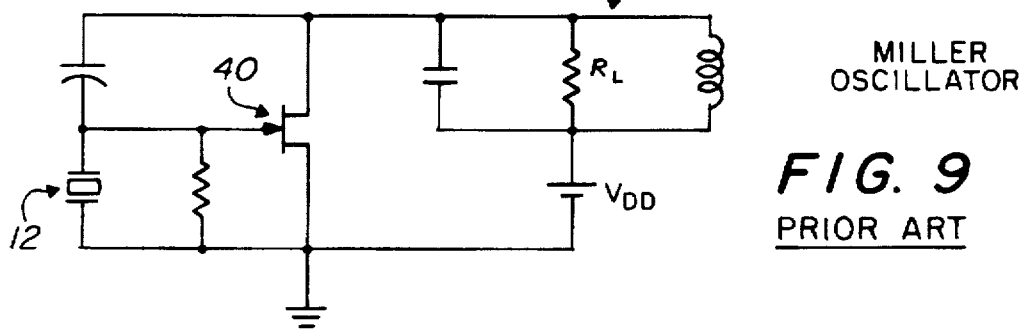
FIG. 9 is a schematic diagram of a Miller oscillator circuit utilizing a crystal therein.

The well-known Miller oscillator circuit of the prior art is illustrated in FIG. 9 in schematic representation. It is similar to a tuned-input, tuned-output circuit in which both the crystal 12 and the output tank circuit 38 look like inductive reactances at the oscillation frequency. Although the output of FET 40, or drain circuit, could consist of just an inductor, a higher effective reactance can be achieved by means of the tuned circuit 38. The principal advantage of this circuit is that one side of the crystal 12 along with one side of any parallel frequency-adjustment capacitor are grounded.

Figure 10:
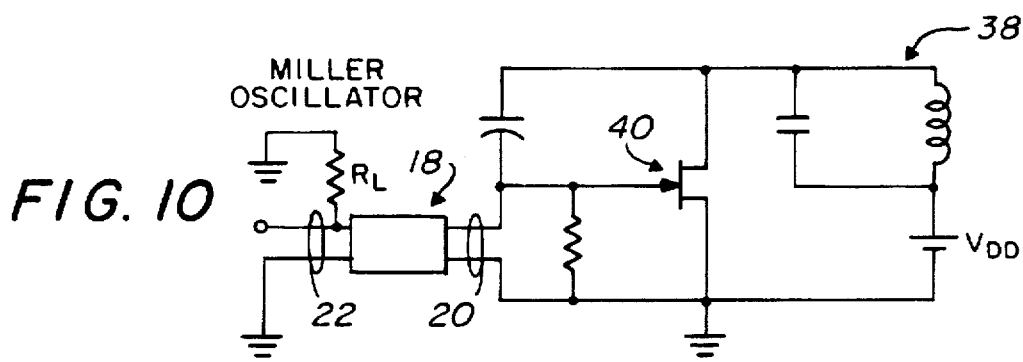
FIG. 10 is a circuit diagram of the Miller oscillator circuit of FIG. 9 with the crystal therein being replaced by the two-port surface acoustic wave resonator filter of the present invention.

FIG. 10 illustrates a circuit diagram of a Miller oscillator such as that shown in FIG. 9 that has been modified to form an oscillator of the present invention. Again, it has the two-pole SAW resonator filter 18 having its first port input terminals 20 coupled in place of the crystal 12 between the gate of FET 40 and ground. The second port terminals 22 form an output from which the oscillator frequency is taken. Again, the amplifying device 40 may be any kind of gain device such as a transistor or a FET.

Many other crystal oscillator circuits exist and there is a considerable body of literature showing examples of circuits that worked with the design procedure unstated. There are many existing excellent surveys of crystal oscillator types and performance.

Thus, there has been disclosed a novel oscillator circuit which is a crystal-controlled feedback oscillator circuit that has been improved by replacing the crystal with one port of a two-port surface acoustic wave resonator filter and extracting the oscillation frequency at the terminals of the other port of the filter. The improvement can be made to any crystal-controlled oscillator circuit that has an amplifier, a signal feedback circuit, a crystal for controlling the oscillator frequency, and an output signal terminal.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

We claim:

1. In a crystal-controlled oscillator circuit having an amplifier, a signal feedback circuit, a crystal for controlling the oscillator frequency, and an output signal terminal, the improvement including:

a piezoelectric material having first and second acoustically coupled electrical signal ports thereon;

said first signal port having a low-loss, primarily inductive characteristic replacing said crystal in said oscillator circuit; and said first and second signal ports forming a signal filter that includes said output signal terminal for providing said oscillator frequency with substantially reduced harmonics when compared to the output of said crystal-controlled oscillator.

2. The improvement of claim 1 further including a two-port SAW resonator filter formed by the piezoelectric material having said first and second acoustically couple ports thereon.

3. The improvement as in claim 2 wherein said crystal-controlled oscillator is a Colpitts oscillator circuit.

4. The improvement as in claim 2 wherein said crystal-controlled oscillator circuit is a Pierce oscillator circuit.

5. The improvement as in claim 2 wherein said crystal-controlled oscillator is a Miller oscillator circuit.

6. The improvement as in claim 2 wherein said crystal-controlled oscillator is a Clapp oscillator circuit.

7. The improvement as in claim 3 further including:

a transistor as said amplifier, said transistor having a base, a collector, and an emitter;

a first resistor coupled between said emitter and a ground potential;

first and second series connected capacitors coupled from said collector to said ground potential;

an electrical power source;

an inductance coupling the power source to the collector of said transistor;

a pair of series coupled resistors coupling the power source to said ground potential;

a third capacitor coupled between said ground potential and said transistor base, said transistor base also being connected to the junction between said pair of series coupled resistors; and said first signal port of said SAW resonator filter being connected in series-resonance mode from a point between said first and second series connected capacitors to the emitter of said transistor.

8. The improvement as in claim 3 further including:

a transistor as said amplifier, said transistor having a base, a collector, and an emitter;

a first resistor coupled between said emitter and a ground potential;

first and second series connected capacitors coupled from said collector to said ground potential;

an electric power source;

an inductor coupling the power source to the collector of said transistor;

a pair of series connected resistors connected between the power source and the ground potential; and said first signal port of said SAW resonator filter being connected between ground potential and said transistor base, said transistor base also being connected to a point between said pair of series connected resistors, said first signal port forming a series-resonant circuit to ground said transistor base.

9. The improvement as in claim 1 wherein said amplifier is a Field Effect Transistor (FET).

10. The improvement as in claim 3 wherein:

said amplifier is a transistor having a collector, an emitter, and a base; and said first signal port of said SAW resonator filter provides both the oscillation frequency and the feedback between said collector and emitter of said transistor.

11. The improvement as in claim 3 wherein:

said amplifier is a transistor having a collector, an emitter, and a base; and said first signal port of said SAW resonator filter is connected between said transistor base and ground to establish said oscillator frequency.

12. The improvement as in claim 4 wherein:

said amplifier is a FET transistor having a source, a drain, and a gate; and said first signal port of said SAW resonator filter is coupled between said FET transistor drain and said FET transistor gate to provide feedback and to establish said oscillation frequency.

13. The improvement as in claim 5 wherein:

said amplifier is a FET transistor having a source, a drain, and a gate;

an output tank circuit coupled to said drain; and said first signal port of said SAW resonator filter being coupled between said gate and said source of said FET transistor to establish said oscillation frequency.

14. The improvement as in claim 6 wherein:

said amplifier is a transistor having a base, collector, and an emitter; and said first signal port of said SAW resonator filter being coupled between said collector and ground for establishing said oscillation frequency.

* * * * *